United States Patent
Fujii et al.

(10) Patent No.: US 12,464,951 B2
(45) Date of Patent: Nov. 4, 2025

(54) VIBRATION DEVICE

(71) Applicant: Seiko Epson Corporation, Tokyo (JP)

(72) Inventors: Masahiro Fujii, Shiojiri (JP); Ryuichi Kurosawa, Hara (JP)

(73) Assignee: SEIKO EPSON CORPORATION (JP)

( * ) Notice: Subject to any disclaimer, the term of this patent is extended or adjusted under 35 U.S.C. 154(b) by 917 days.

(21) Appl. No.: 17/685,447

(22) Filed: Mar. 3, 2022

(65) Prior Publication Data

US 2022/0285605 A1  Sep. 8, 2022

(30) Foreign Application Priority Data

Mar. 4, 2021 (JP) ................................. 2021-034182

(51) Int. Cl.
| | | |
|---|---|---|
| H01L 41/053 | (2006.01) | |
| H10N 30/87 | (2023.01) | |
| H10N 30/88 | (2023.01) | |

(52) U.S. Cl.
CPC ........... *H10N 30/872* (2023.02); *H10N 30/87* (2023.02); *H10N 30/88* (2023.02)

(58) Field of Classification Search
CPC ....... H10N 30/872; H10N 30/87; H10N 30/88
See application file for complete search history.

(56) References Cited

U.S. PATENT DOCUMENTS

| | | | | |
|---|---|---|---|---|
| 2013/0328449 A1* | 12/2013 | Takahashi | .............. | H10N 30/88 |
| | | | | 310/344 |
| 2014/0361665 A1* | 12/2014 | Hayasaka | ............ | H03H 9/1021 |
| | | | | 310/348 |
| 2015/0123737 A1* | 5/2015 | Yokoo | .................. | H03H 9/1021 |
| | | | | 331/34 |
| 2015/0200647 A1* | 7/2015 | Okamoto | ............. | H03H 9/1021 |
| | | | | 310/344 |
| 2018/0062613 A1* | 3/2018 | Miyazaki | ............. | H03H 9/1021 |
| 2019/0195630 A1* | 6/2019 | Shimura | .................. | H03H 3/04 |

FOREIGN PATENT DOCUMENTS

| | | |
|---|---|---|
| JP | 2007-060593 A | 3/2007 |
| JP | 2008-193175 A | 8/2008 |
| JP | 2016-092437 A | 5/2016 |
| JP | 2018-117243 A | 7/2018 |
| JP | 2020-141264 A | 9/2020 |

OTHER PUBLICATIONS

English Translation of JP 2016092437 May 2016.*

* cited by examiner

*Primary Examiner* — Bryan P Gordon

(74) *Attorney, Agent, or Firm* — Harness, Dickey & Pierce, P.L.C.

(57) ABSTRACT

A vibration device includes a base, a vibrator disposed at the base, an annular resin element that is bonded to the base and surrounds the vibrator in a plan view, and a lid so disposed that the vibrator is sandwiched between the base and the lid. A first metal layer is disposed at a surface of the resin element, the surface facing the lid. A second metal layer is disposed at a surface of the lid, the surface facing the resin element. The vibrator is encapsulated by the base, the resin element, and the lid when the first metal layer and the second metal layer are bonded to each other.

7 Claims, 6 Drawing Sheets

VIBRATION DEVICE

The present application is based on, and claims priority from JP Application Serial Number 2021-034182, filed Mar. 4, 2021, the disclosure of which is hereby incorporated by reference herein in its entirety.

BACKGROUND

1. Technical Field

The present disclosure relates to a vibration device.

2. Related Art

For example, JP-A-2020-141264 discloses a piezoelectric vibration device which includes a piezoelectric diaphragm having a vibrating section and in which the vibrating section is encapsulated by resin films bonded to the two primary surfaces, of the piezoelectric diaphragm, around the vibrating section. According to JP-A-2020-141264, employing the structure described above allows provision of an inexpensive piezoelectric vibration device.

However, the structure described in JP-A-2020-141264, in which the vibrating section is encapsulated by the resin films made of an organic material, is inferior in terms of airtightness to a configuration in which the vibrating section is encapsulated by an inorganic material and therefore has a problem of a tendency to cause a change over time in the frequency of the vibration device.

SUMMARY

A vibration device includes a base having a first surface and a second surface that is in a front-back relationship with the first surface, a vibrator disposed at the first surface, an annular resin element that has a third surface bonded to the first surface and a fourth surface that is in a front-back relationship with the third surface the annular resin element surrounding the vibrator in a plan view in a direction perpendicular to the first surface, and a lid that has a fifth surface and a sixth surface that is in a front-back relationship with the fifth surface, the lid so disposed that the vibrator is sandwiched between the first surface and the fifth surface. A first metal layer is disposed at a surface containing the fourth surface of the resin element. A second metal layer is disposed at the fifth surface of the lid. The vibrator is encapsulated by the base, the resin element, and the lid when the first metal layer and the second metal layer are bonded to each other.

DESCRIPTION OF EXEMPLARY EMBODIMENTS

In the following drawings, the description will be made using three axes called axes X, Y, and Z perpendicular to one another. The direction along the axis X is called a "direction X", the direction along the axis Y is called a "direction Y", and the direction along the axis Z is called a "direction Z", with the direction indicated by an arrow is the positive direction and the direction opposite the positive direction is the negative direction. The direction +Z is also called "upper" or "upward", and the direction −Z is also called "lower" or "downward" in some cases, and a view in the direction +Z is also called a plan view or planar. The description will be made on the assumption that a surface facing the positive side of the direction Z is called an upper surface, and that a surface facing the negative side of the direction Z, which is a surface opposite from the upper surface, is called a lower surface.

Furthermore, in the following description, consider, for example, a substrate, and the phrase "on the substrate" represents any of the following cases: a case where something is disposed on the substrate so as to be in contact therewith; a case where something is disposed above the substrate via another structure; and a case where something is disposed at the substrate so as to be partially in contact therewith and partially separate therefrom via another structure.

The configuration of a vibration device 100 will first be described with reference to FIGS. 1 to 3.

Figure 1:
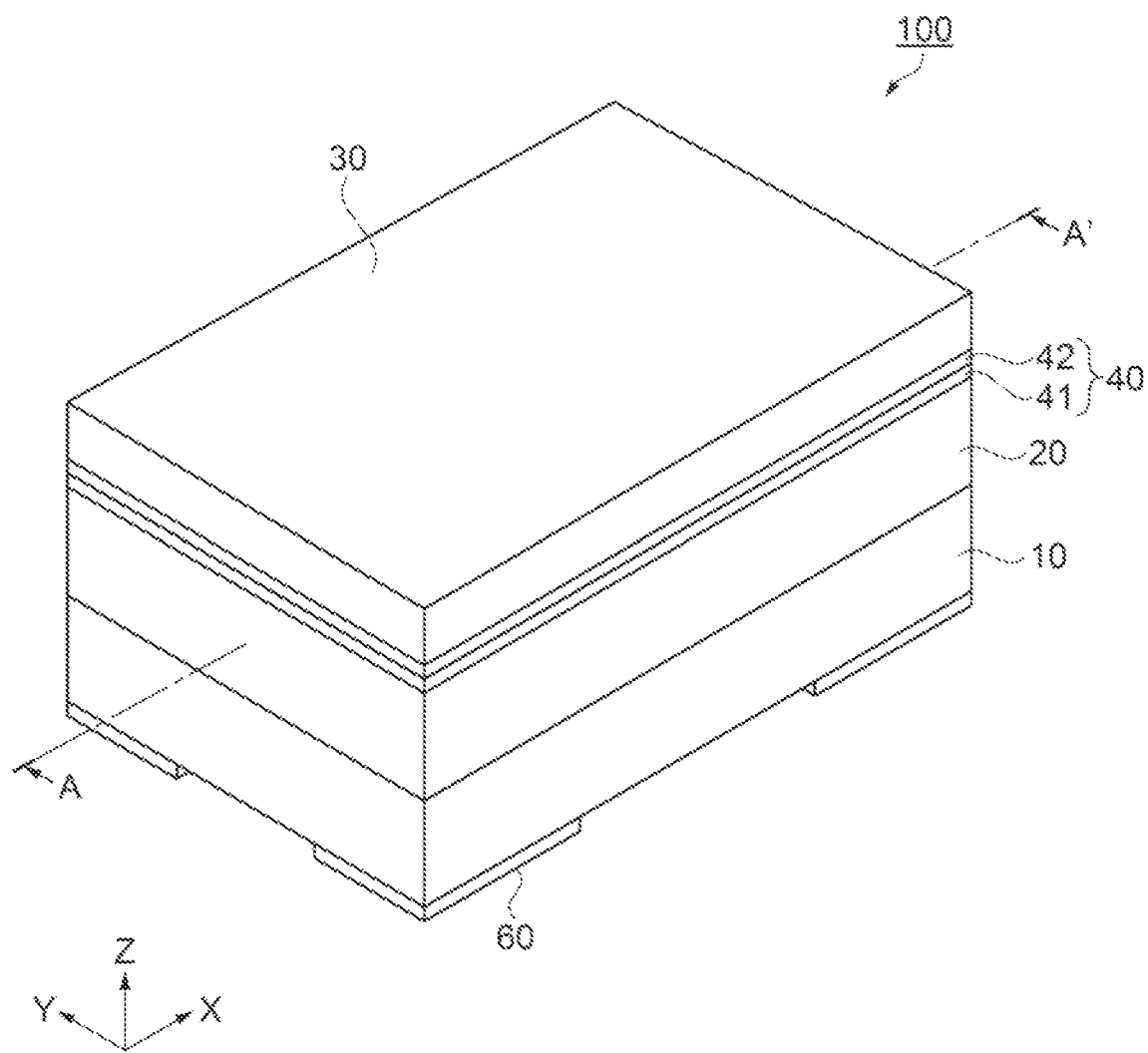
FIG. 1 is a schematic perspective view showing the configuration of a vibration device.

The vibration device 100 includes a base 10, a resin element 20 disposed on the base 10, a lid 30 disposed above the resin element 20, and a bonding section 40, which bonds the resin element 20 to the lid 30, as shown in FIG. 1.

A semiconductor substrate 50 (see FIG. 2), which will be described later, is disposed at the upper surface of the base 10. The lower surface of the base 10 is provided with external terminals 60, which provide electrical coupling to an external component. A vibrator 70 (see FIG. 2), which will be described later, is disposed above the base 10. The resin element 20 is disposed in an annular shape above the base 10 so as to surround the vibrator 70. The vibrator 70 can then be encapsulated by placing the lid 30 above the resin element 20.

The bonding section 40 bonds the resin element 20 and the lid 30 to each other via a first metal layer 41 and a second metal layer 42 to enhance the airtightness of the bonded structure. The configuration of the vibration device 100 will be specifically described below with reference to FIGS. 2 and 3.

Figure 2:
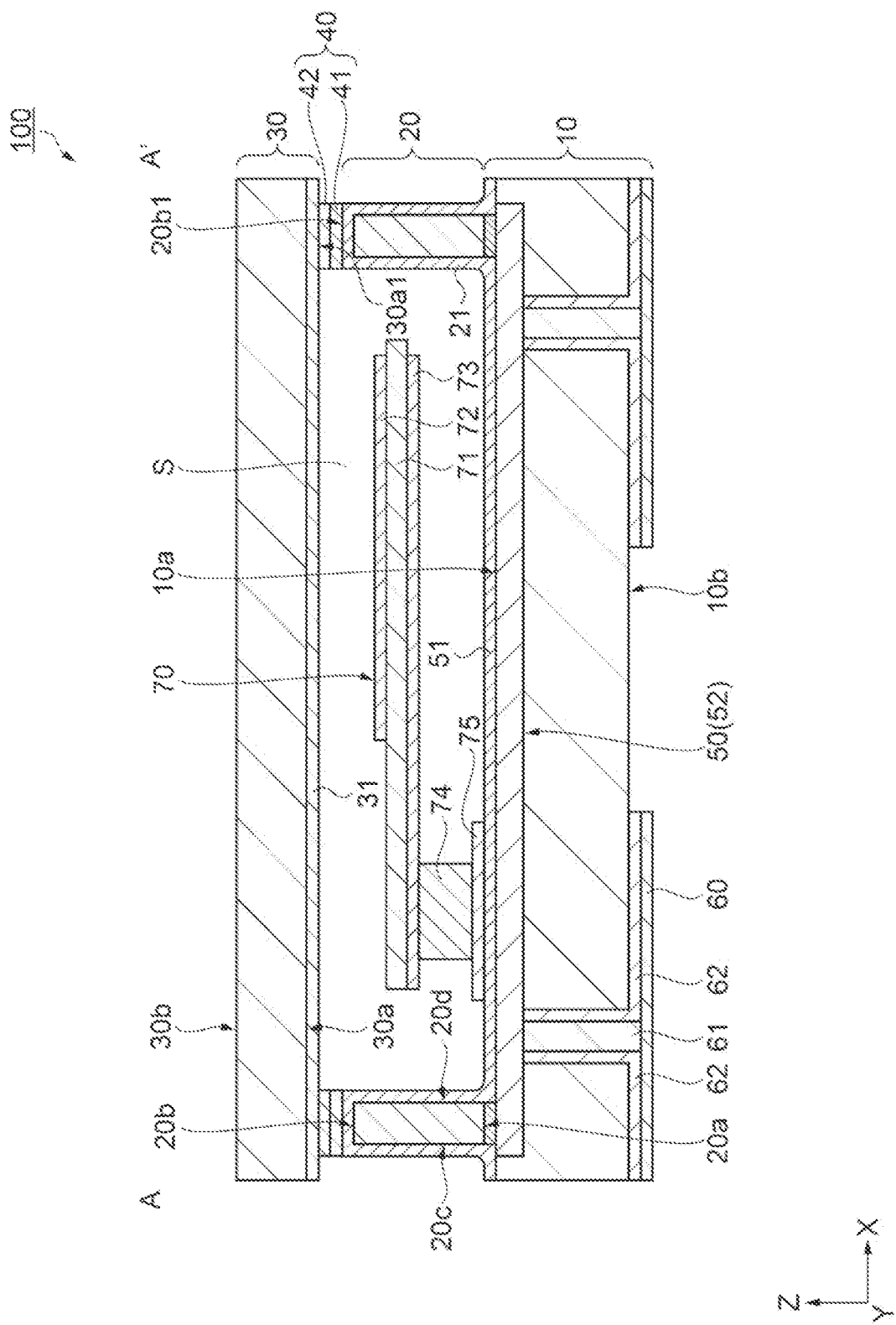
FIG. 2 is a cross-sectional view of the vibration device shown in FIG. 1 taken along the line A-A'.
Figure 3:
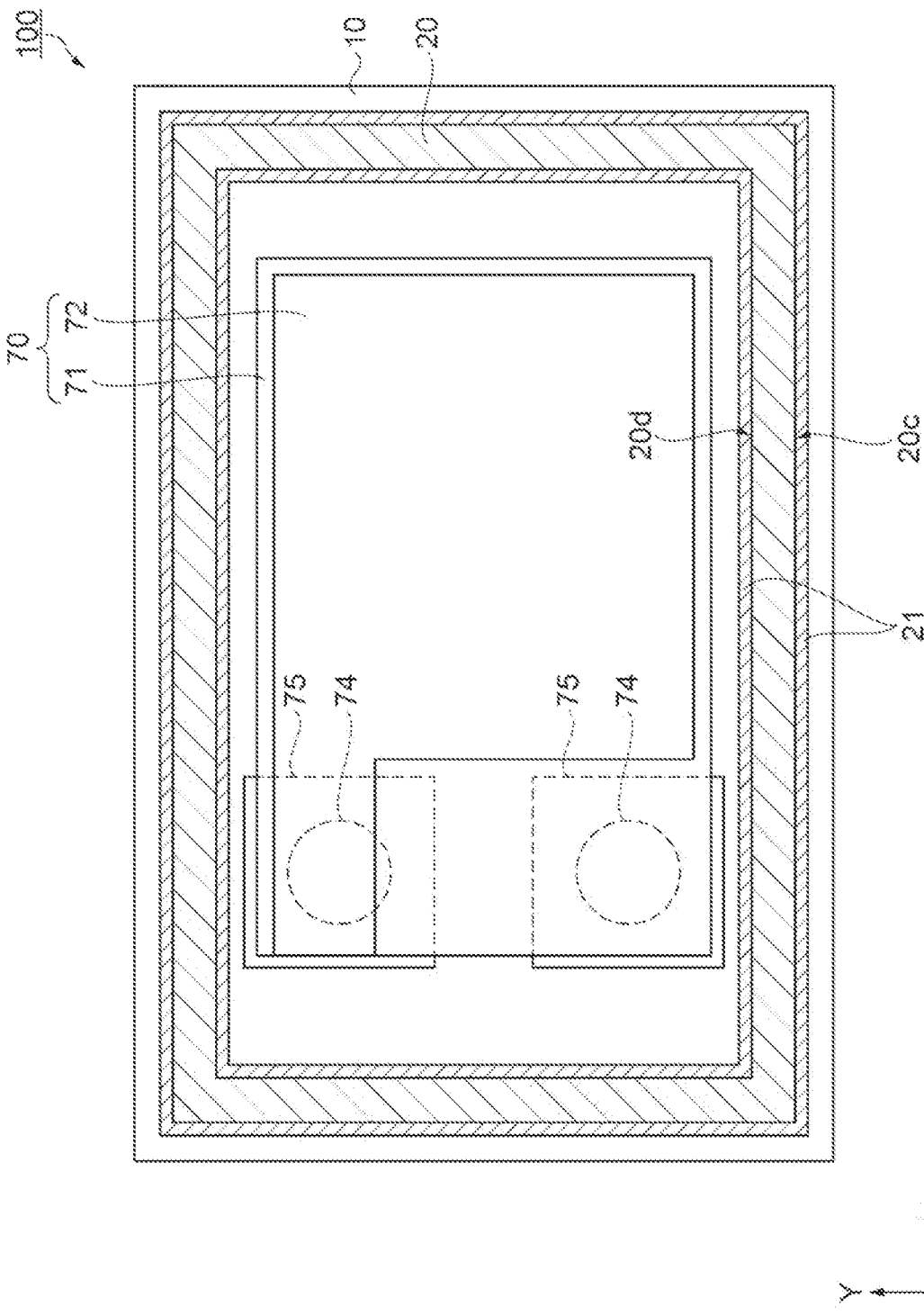
FIG. 3 is a plan view showing the configuration of the vibration device with a lid removed.
Figure 4:
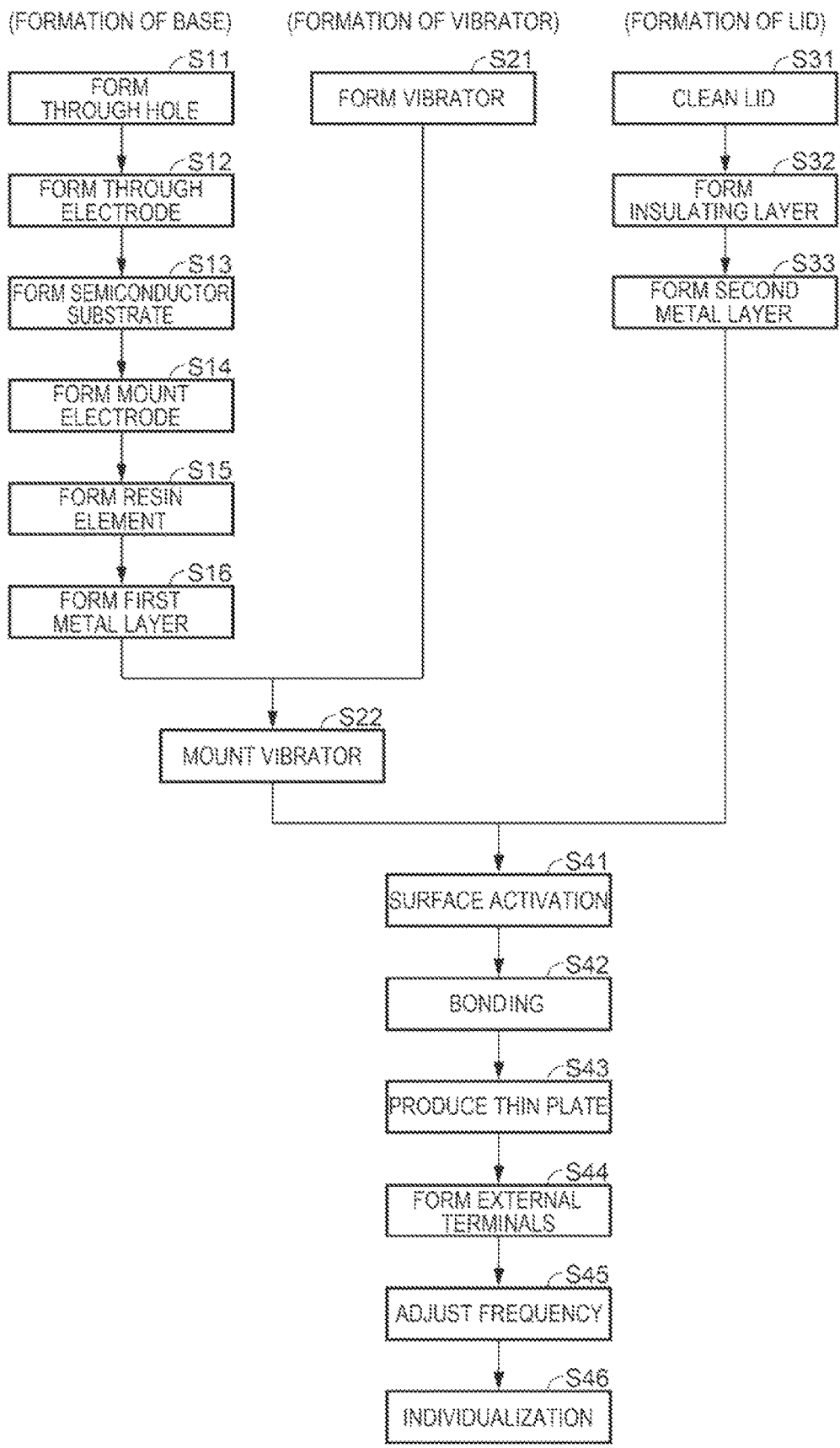
FIG. 4 is a flowchart showing a method for manufacturing the vibration device with the steps of the method arranged in the execution order.

The base 10 of the vibration device 100 has a first surface 10a, which faces the side on which the vibrator 70 is disposed, and a second surface 10b, which is a rear surface with respect to a front surface that is the first surface 10a and which faces the side on which the external terminals 60 are disposed, as shown in FIGS. 2 and 3.

The resin element 20 has a third surface 20a, which is bonded to the first surface 10a of the base 10, and a fourth surface 20b, which is a rear surface with respect to a front surface that is the third surface 20a. The resin element 20 is disposed in an annular shape above the base 10 so as to surround the vibrator 70 in the plan view (viewed in direction perpendicular to the first surface 10a), as shown in FIG. 3. The material of the resin element 20 can be a known material, for example, a photosensitive resin.

Side surfaces 20c and 20d of the resin element 20, which are coupled to the third surface 20a and the fourth surface 20b, are coated with a protective film 21 made of an inorganic material. The inorganic material is, for example, a silicon oxide ($SiO_2$). The fourth surface 20b of the resin element 20 is also coated with the protective film 21. The configuration in which the fourth surface 20b and the side surfaces 20c and 20d of the resin element 20 are coated with the protective film 21 allows an increase in gas barrier property provided by the resin element 20 and improvement in the airtightness provided thereby.

The lid 30 has a fifth surface 30a, which faces the side on which the vibrator 70 is disposed, and a sixth surface 30b, which is a rear surface with respect to a front surface that is the fifth surface 30a. That is, the lid 30 can be so disposed that the vibrator 70 is sandwiched between the fifth surface 30a of the lid 30 and the first surface 10a of the base 10. The lid 30 is formed, for example, of a silicon substrate. An insulating layer 31 is formed at the fifth surface 30a of the lid 30. The insulating layer 31 is made, for example, of a silicon oxide ($SiO_2$).

The semiconductor substrate 50 including an integrated circuit 52 is disposed on the side facing at least one of the first surface 10a and the second surface 10b of the base 10, as described above. The resin element 20 is disposed so as to overlap with at least part of the integrated circuit 52, as shown in FIG. 2. In other words, the resin element 20 is disposed so as to overlap with at least part of the semiconductor substrate 50 including the integrated circuit 52. The integrated circuit 52 is a circuit including active elements, such as transistors.

An insulating layer 51 is formed at the first surface 10a of the base 10. The insulating layer 51 is, for example, made of a silicon oxide ($SiO_2$). The insulating layer 51 has a thickness of, for example, 1 μm. That is, the insulating layer 51 covers the upper surface of the semiconductor substrate 50 including the integrated circuit 52. The insulating layer 51 has the function of protecting the integrated circuit 52.

Since the resin element 20 is disposed so as to overlap with the semiconductor substrate 50 including the integrated circuit 52 as described above, the size of the vibration device 100 can be reduced as compared with a case where the resin element 20 is disposed so as not to overlap with the integrated circuit 52. Furthermore, even when the placement of the integrated circuit 52 on the side facing the first surface 10a causes unevenness of the bonding surface of the base 10, the resin element 20 can absorb the unevenness, whereby the airtightness of the vibration device 100 can be improved.

The bonding section 40 is a portion where the first metal layer 41 disposed at the fourth surface 20b of the resin element 20 and the second metal layer 42 disposed at the fifth surface 30a of the lid 30 are bonded to each other by activated bonding. Activated bonding progresses in accordance with the free energy of an activated metal surface, and the diffusion and re-organization of the metal atoms completes the bonded layer, so that no bonded interface is present after the bonding, and bonding strength close to the base metal strength of the material is achieved. Furthermore, since no excessive heat or pressure is applied during the bonding, residual stress after the bonding can be suppressed, whereby the effect of variation in the frequency of the vibrator 70 can be suppressed.

Each of the first metal layer 41 and the second metal layer 42 functions as a bonding metal and is made of a material containing gold (Au). The first metal layer 41 and the second metal layer 42 in the present embodiment are each formed of a thin gold film. Since the first metal layer 41 and the second metal layer 42 are each formed of a thin gold film, no metal oxide film is formed at the surface of the first metal layer 41 or the second metal layer 42. There is therefore no need to remove metal oxide films in the activated bonding or atomic diffusion bonding, whereby the first metal layer 41 and the second metal layer 42 can be readily bonded to each other. In addition, since the surface roughness of the layers is small, the bonding can be achieved at room temperature with no or little load. Therefore, the functions of an insulating layer, CMOS transistors, capacitors, and other circuit elements below the bonding section 40 are not impaired by the bonding.

The first metal layer 41 provided at the resin element 20 has a thickness of, for example, 20 nm. The second metal layer 42 provided at the lid 30 has a thickness of, for example, 20 nm. That is, the bonding section 40 formed of the first metal layer 41 and the second metal layer 42 has a thickness of 40 nm. For example, a film made of titanium (Ti) or a laminate of films made of titanium (Ti) and tungsten (W) may be used as an adhesion layer underneath each of the first metal layer 41 and the second metal layer 42. The adhesion layers can serve as stress relaxation layers that reduce stress induced by a difference in linear expansion, whereby the reliability of the vibration device can be increased.

The vibrator 70 is mounted in the form of a cantilever on the first surface 10a of the base 10. The vibrator 70 includes a vibration substrate 71, an excitation electrode 72 disposed at the upper surface of the vibration substrate 71, and an excitation electrode 73 disposed at the lower surface of the vibration substrate 71. The vibrator 70 is electrically coupled to the integrated circuit 52 in the semiconductor substrate 50 via an electrically conductive bonding member 74, which is coupled to the excitation electrodes 72 and 73, and a mount electrode 75.

The vibrator 70 is encapsulated in a vacuum by the base 10, the resin element 20, and the lid 30 when the first metal layer 41 and the second metal layer 42 are bonded to each other. A sealed space S is thus formed in the vibration device 100.

The external terminals 60 are formed at the second surface 10b of the base 10. An external terminal 60 is electrically coupled to the integrated circuit 52 in the semiconductor substrate 50 via a through electrode 61 provided through the base 10. An insulating layer 62 is formed between each of the external terminals 60 and the base 10. The insulating layer 62 is also formed between the through electrode 61 and the base 10.

A method for manufacturing the vibration device 100 will next be described with reference to FIGS. 4 to 9. The method for manufacturing the vibration device 100 primarily includes forming the base 10 (and resin element 20), forming the vibrator 70, forming the lid 30, and bonding and individualization.

A method for manufacturing the base 10 will first be described. In step S11, a silicon wafer is prepared, and a through hole for forming the through electrode 61 is formed in a portion, of the silicon wafer, which forms the base 10. Specifically, dry etching is performed on the base 10 to form the through hole. A thermal oxide film is then formed at the inner wall of the through hole to complete the through hole with the insulating layer 62 formed therein.

In step S12, the through electrode 61 is formed. Specifically, for example, the through electrode 61 is formed by burying polysilicon injected with boron (B) in the through hole. The through electrodes 61 may be formed after the semiconductor substrate 50 is formed. It is, however, noted that forming the through electrode 61 first reduces the number of defects in the semiconductor substrate 50, which is a multilayered substrate, and therefore allows formation of a high-quality base 10.

In step S13, the semiconductor substrate 50 including the integrated circuit 52 is formed by using a known manufacturing method. In step S14, the mount electrode 75 is formed on the semiconductor substrate 50. Specifically, the insulating layer 51 is formed at the upper surface of the base 10 including the semiconductor substrate 50. Thereafter, an electrode that is not illustrated but is electrically coupled to the integrated circuit 52 is formed, and the mount electrode 75 and the electrically conductive bonding member 74 are formed on the electrode.

Figure 5:
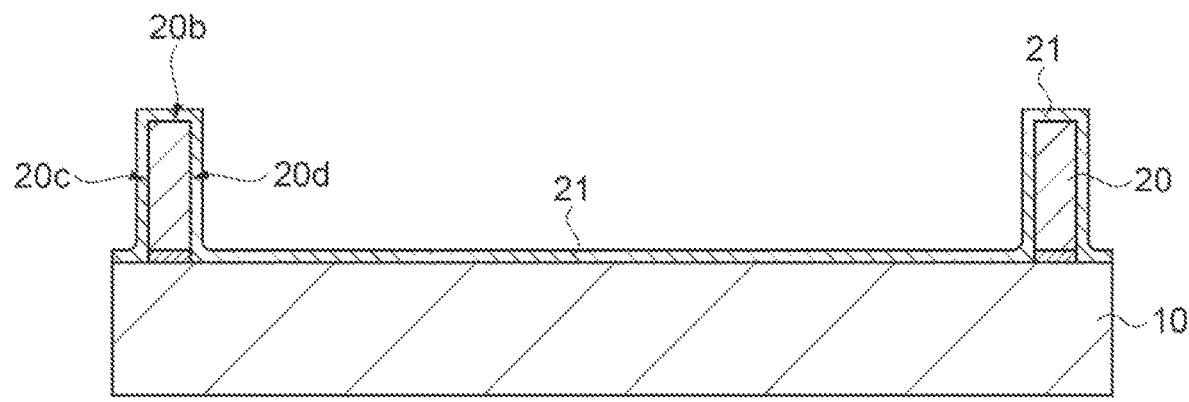
FIG. 5 is a cross-sectional view showing the method for manufacturing the vibration device.

In step S15, the resin element 20 is formed at the upper surface of the base 10. The resin element 20 is first formed by applying, for example, a photosensitive resin onto the periphery of the upper surface of the base 10 (that is, first surface 10a). A silicon oxide, for example, is then deposited over the entire base 10 at which the resin element 20 has been disposed, as shown in FIG. 5. The protective film 21 made of the silicon oxide is formed over the entire surface of the resin element 20 extending from the upper surface (that is, fourth surface 20b) to the side surfaces 20c and 20d thereof.

Figure 6:
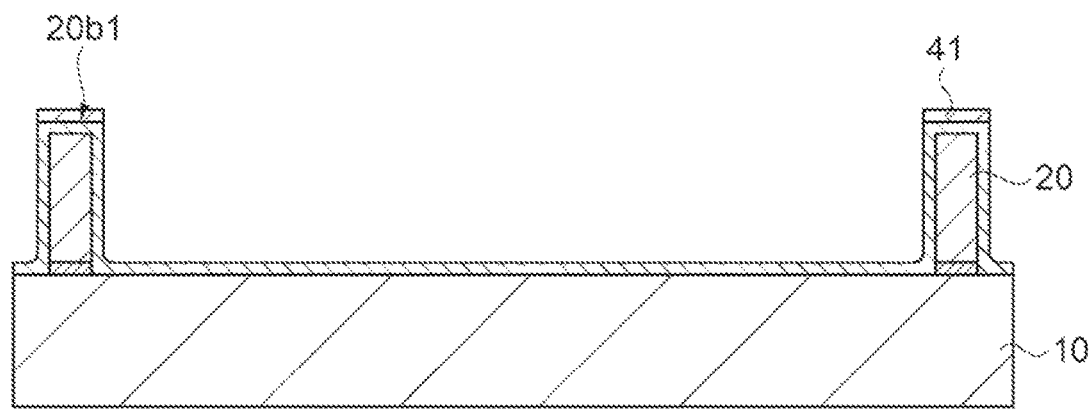
FIG. 6 is a cross-sectional view showing the method for manufacturing the vibration device.

In step S16, the first metal layer 41, which forms the bonding section 40, is formed at the fourth surface 20b of the resin element 20. Specifically, a thin gold (Au) film is formed at a bonding surface 20b1 of the resin element 20, the surface where the bonding section 40 is formed, for example, by sputtering and etching, with a thin titanium (Ti) film used as an underlying layer, as shown in FIG. 6. The combined thickness of the thin titanium film and the thin gold film is, for example, 20 nm.

Thereafter, in step S21, the vibrator 70 is formed by using a known manufacturing method. In step S22, the vibrator 70 is mounted on the base 10. Specifically, terminals of the vibrator 70, which are not illustrated, are electrically coupled to the mount electrode 75 via the electrically conductive bonding member 74. The vibrator 70 is thus mounted on the first surface 10a of the base 10.

Figure 7:
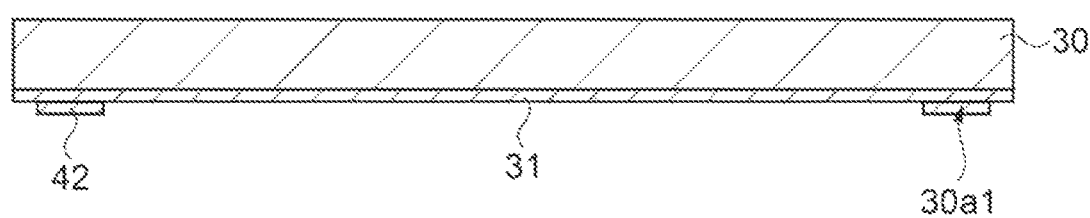
FIG. 7 is a cross-sectional view showing the method for manufacturing the vibration device.

A method for manufacturing the lid 30 will next be described. In step S31, a silicon wafer that forms the lid 30 is cleaned. In step S32, a silicon oxide is deposited over the entire surface of the fifth surface 30a of the lid 30 to form the insulating layer 31, as shown in FIG. 7.

In step S33, the second metal layer 42, which forms the bonding section 40, is formed at the lid 30. Specifically, a thin gold (Au) film is formed at a bonding surface 30a1 of the lid 30, the surface where the bonding section 40 is formed, for example, by sputtering and etching, with a thin titanium (Ti) film used as an underlying layer, as shown in FIG. 7. The combined thickness of the thin titanium film and the thin gold film is, for example, 20 nm.

The bonding and individualization will next be described. In step S41, the surfaces of the first metal layer 41 and the second metal layer 42 are activated. In step S42, the first metal layer 41 and the second metal layer 42 are bonded to each other by activated bonding.

Figure 8:
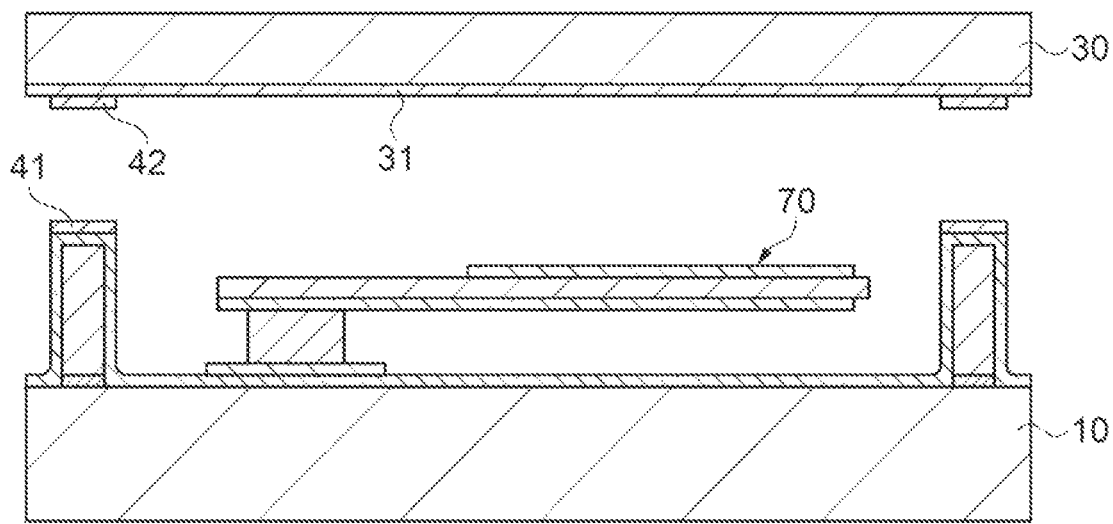
FIG. 8 is a cross-sectional view showing the method for manufacturing the vibration device.

The surface of the first metal layer 41 and the surface of the second metal layer 42 are first activated, as shown in FIG. 8. Specifically, the surfaces of the first metal layer 41 and the second metal layer 42 are activated by irradiating the first metal layer 41 and the second metal layer 42, for example, with a neutral argon ion beam.

Figure 9:
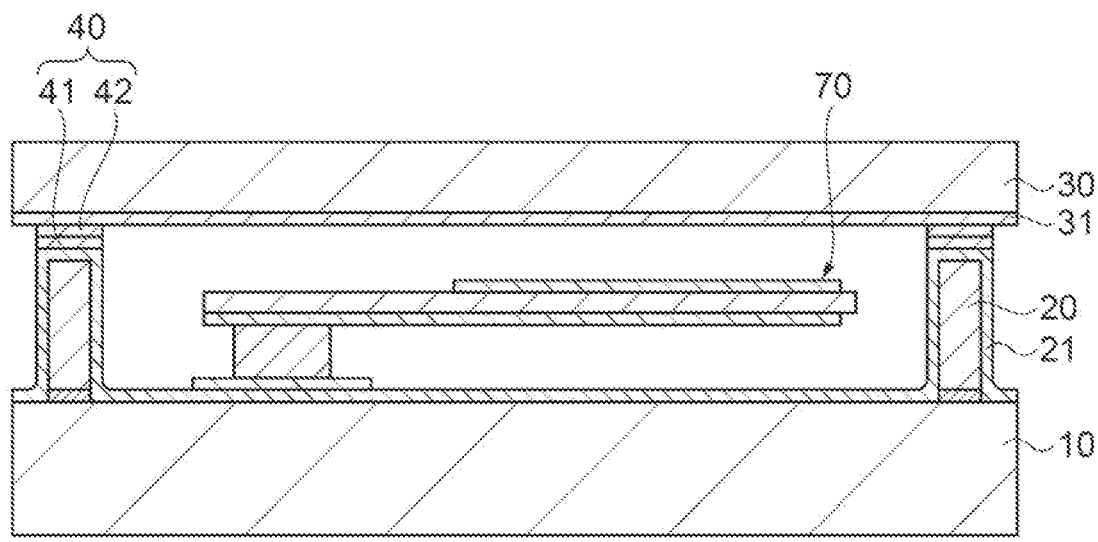
FIG. 9 is a cross-sectional view showing the method for manufacturing the vibration device.

The lid 30 is then placed on the base 10 on which the vibrator 70 and the resin element 20 have been disposed, and the first metal layer 41 and the second metal layer 42 are brought into contact with each other, as shown in FIG. 9. That is, the silicon wafer that forms the base 10 and the silicon wafer that forms the lid 30 are attached to each other.

According to the thus performed activated bonding, the metal atoms at the surfaces of the first metal layer 41 and the second metal layer 42, gold (Au) atoms in the present embodiment, diffuse and re-organize at the surface where the first metal layer 41 and the second metal layer 42 come into contact with each other, resulting in strong bonding between the metal layers with no bonding interface. Furthermore, smoothing the surfaces of the first metal layer 41 and the second metal layer 42 allows the bonding only with the free surface energy of the surfaces of the first metal layer 41 and the second metal layer 42, whereby the bonding can be performed at room temperature without aggressive pressure application.

In this process, pressure may or may not be applied. When pressure is applied, the bonding at room temperature can be more reliably performed. When the surfaces are smooth, for example, when the surface roughness (Ra: arithmetic mean roughness) is 5 nm or smaller, the bonding can be achieved instantaneously only with the free surface energy, so that no large pressure application is required and no aggressive pressure application is required.

Furthermore, the bonding of the lid 30 above the circuit elements, such as CMOS transistors and capacitors, below the bonding section 40 without impairment of the functions of the circuit elements and the insulating film due to a load, heat, and other burdens during the bonding, the size of the vibration device 100 can be reduced, and the number of vibration devices 100 produced from the silicon wafer can be ensured. In this case, the burden on a bonding apparatus is smaller, whereby the bonding can be performed with a less expensive apparatus.

Moreover, since excessive pressure or heat is not applied during the bonding, damage to the integrated circuit during the bonding can be reduced even in the configuration in which the resin element 20 overlaps with at least part of the integrated circuit 52. The size of the vibration device 100 can be further reduced.

In the present embodiment, the first metal layer 41 and the second metal layer 42 are bonded to each other by activated bonding, and atomic diffusion bonding may also be used. Using atomic diffusion bonding allows the first metal layer 41 and the second metal layer 42 to be bonded to each other without applying excessive pressure or heat during the bonding, as in the activated bonding.

The activated bonding bonds the first metal layer 41 and the second metal layer 42 to each other into the bonding section 40. The silicon wafer that forms the base 10 and the silicon wafer that forms the lid 30 are thus attached to each other into a silicon wafer in which a plurality of vibration devices 100 are collectively formed.

In step S43, the silicon wafer may be polished or ground into a thin plate to reduce the thickness of the vibration devices 100. In step S44, the insulating layer 62 and the external terminals 60 are formed at the second surface 10b of the base 10. In step S45, the frequency of the vibration device is adjusted.

In step S46, the vibration devices 100 are separated from the silicon wafer or individualized by using dicing or any other cutting method. The vibration devices 100 can be manufactured by carrying out the manufacturing steps described above.

As described above, the vibration device 100 according to the present embodiment includes the base 10, which has the first surface 10*a* and the second surface 10*b*, which is a rear surface with respect to a front surface that is the first surface 10*a*, the vibrator 70 disposed at the first surface 10*a*, the annular resin element 20, which has the third surface 20*a* bonded to the first surface 10*a*, and the fourth surface 20*b*, which is a rear surface with respect to a front surface that is the third surface 20*a*, and surrounds the vibrator 70 in the plan view in the direction perpendicular to the first surface 10*a*, and the lid 30, which has the fifth surface 30*a* and the sixth surface 30*b*, which is a rear surface with respect to a front surface that is the fifth surface 30*a*, and is so disposed that the vibrator 70 is sandwiched between the first surface 10*a* and the fifth surface 30*a*. The first metal layer 41 is disposed at the fourth surface 20*b* of the resin element 20. The second metal layer 42 is disposed at the fifth surface 30*a* of the lid 30. The vibrator 70 is encapsulated by the base 10, the resin element 20, and the lid 30 when the first metal layer 41 and the second metal layer 42 are bonded to each other.

According to the configuration described above, since the first metal layer 41 and the second metal layer 42, which are each made of an inorganic material, are bonded to each other for the sealing, the airtightness of the vibration device can be increased as compared with a case where the first metal layer 41 and the second metal layer 42 are each made of an organic material, whereby changes over time in the frequency of the vibrator 70, that is, the vibration device 100 can be suppressed. Furthermore, since the resin element 20 is disposed between the base 10 and the lid 30, the resin element 20 can absorbs any unevenness in the area, of the base 10, that overlaps with the bonding section 40, whereby the airtightness of the vibration device can be improved.

In addition to the fourth surface 20*b*, the first metal layer 41 may be disposed at the side surfaces 20*c* and 20*d* of the resin element 20, and covering the resin element by the first metal layer 41 further increases the airtightness of the vibration device.

In the vibration device 100, it is preferable that the side surfaces 20*c* and 20*d* of the resin element 20 that are coupled to the third surface 20*a* and the fourth surface 20*b* are coated with the protective film 21. The configuration in which the side surfaces 20*c* and 20*d* of the resin element 20 are coated with the protective film 21 allows an increase in the gas barrier property of the vibration device and a further increase in the airtightness thereof.

In the vibration device 100, it is preferable that the protective film 21 provided at the resin element 20 is disposed between the fourth surface 20*b* and the first metal layer 41. According to the configuration described above, after the resin element 20 is disposed on the base 10, the entire resin element 20 may be coated with the protective film 21, so that the protective film 21 does not need to be partially removed, whereby the manufacturing process can be readily carried out.

In the vibration device 100, it is preferable that the first metal layer 41 and the second metal layer 42 are bonded to each other by activated bonding. According to the configuration described above, the activated bonding allows strong bonding with no bonding interface. The first metal layer 41 and the second metal layer 42 can therefore be bonded to each other at room temperature without aggressive pressure application.

In the vibration device 100, it is preferable that the first metal layer 41 and the second metal layer 42 each contain gold. According to the configuration described above, since the first metal layer 41 and the second metal layer 42 each contain gold, no metal oxide film is formed at the surfaces of the first metal layer 41 and the second metal layer 42. There is therefore no need to remove metal oxide films in the activated bonding or atomic diffusion bonding, whereby the first metal layer 41 and the second metal layer 42 can be readily bonded to each other.

In the vibration device 100, it is preferable that the semiconductor substrate 50 including the integrated circuit 52 is disposed at least at one of the first surface 10*a* and the second surface 10*b* of the base 10. According to the configuration described above, since the semiconductor substrate 50 is disposed at the first surface 10*a* and/or the second surface 10*b* of the base 10, the size of the vibration device 100 can be reduced as compared with a case where the semiconductor substrate 50 is configured as a component separate from the base 10.

In the vibration device 100, it is preferable that the integrated circuit 52 is disposed at the first surface 10*a*, and the resin element 20 is disposed so as to overlap with at least part of the integrated circuit 52 in the plan view. According to the configuration described above, since the resin element 20 is disposed so as to overlap with the integrated circuit 52, the size of the vibration device 100 can be reduced as compared with a case where the resin element 20 is disposed so as not to overlap with the integrated circuit 52. Furthermore, even when the placement of the integrated circuit 52 at the first surface 10*a* cause unevenness of a layer below the bonding section 40 in the base 10, the resin element 20 can absorb the unevenness, whereby the airtightness of the vibration device 100 can be improved.

In the vibration device 100, it is preferable that the external terminals 60 are disposed at the second surface 10*b*, and that an external terminal 60 is electrically coupled to the integrated circuit 52 via the through electrode 61 disposed in the base 10. According to the configuration described above, since the external terminal 60 electrically coupled to the integrated circuit 52 is disposed at the second surface 10*b*, the electrical characteristics of the integrated circuit 52 can be checked, for example, by using the external terminal 60 in the state in which the vibration device is still in the form of a silicon wafer.

Variations of the embodiment described above will be described below.

In the embodiment described above, the lid 30 is formed of a silicon substrate and may instead be made, for example, of borosilicate glass. Since borosilicate glass has a coefficient of linear expansion comparable to that of the base 10 formed of a silicon wafer, variation in the frequency of the vibrator due to thermal stress can be suppressed, and step S32 of forming the insulating layer 31 can be omitted.

The second metal layer 42 may be formed over the entire fifth surface 30*a*. Since the second metal layer 42 can electrostatically shields the space S, the influence of noise can be suppressed, and the etching step of forming the second metal layer 42 only at the bonding section 40 can be omitted.

The vibration device 100 described above can be suitably used as an oscillator and an inertia sensor, such as an acceleration sensor and an angular velocity sensor.

What is claimed is:
1. A vibration device comprising:
a base having a first surface and a second surface that is in a front-back relationship with the first surface;

a vibrator disposed at the first surface;

an annular resin element that has a third surface bonded to the first surface and a fourth surface that is in a front-back relationship with the third surface, the annular resin element surrounding the vibrator in a plan view in a direction perpendicular to the first surface and side surfaces of the resin element that are coupled to the third surface and the fourth surface are coated with a protective film made of an inorganic material; and a lid that has a fifth surface and a sixth surface that is in a front-back relationship with the fifth surface, the lid so disposed that the vibrator is sandwiched between the first surface and the fifth surface, wherein a first metal layer is disposed at a surface containing the fourth surface of the resin element, a second metal layer is disposed at the fifth surface of the lid, and the vibrator is encapsulated by the base, the resin element, and the lid when the first metal layer and the second metal layer are bonded to each other.

2. The vibration device according to claim 1,
wherein the protective film provided at the resin element is disposed between the fourth surface and the first metal layer.

3. The vibration device according to claim 1,
wherein the first metal layer and the second metal layer are bonded to each other by activated bonding.

4. The vibration device according to claim 1,
wherein the first metal layer and the second metal layer each contain gold.

5. The vibration device according to claim 1,
wherein a semiconductor substrate including an integrated circuit is disposed at least at one of the first surface and the second surface of the base.

6. The vibration device according to claim 5,
wherein the integrated circuit is disposed at the first surface, and
the resin element is disposed so as to overlap with at least part of the integrated circuit in the plan view.

7. The vibration device according to claim 6,
wherein an external terminal is disposed at the second surface, and
an external terminal is electrically coupled to the integrated circuit via a through electrode disposed in the base.

\* \* \* \* \*